United States Patent
Otsuka et al.

(10) Patent No.: US 7,414,261 B2
(45) Date of Patent: Aug. 19, 2008

(54) BALLISTIC SEMICONDUCTOR DEVICE

(75) Inventors: Nobuyuki Otsuka, Kawanishi (JP); Koichi Mizuno, Nara (JP); Shigeo Yoshii, Hirakata (JP); Asamira Suzuki, Osakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/542,063

(22) PCT Filed: Apr. 14, 2004

(86) PCT No.: PCT/JP2004/005282
§ 371 (c)(1),
(2), (4) Date: May 15, 2006

(87) PCT Pub. No.: WO2004/093199
PCT Pub. Date: Oct. 28, 2004

(65) Prior Publication Data
US 2006/0231862 A1 Oct. 19, 2006

(30) Foreign Application Priority Data
Apr. 15, 2003 (JP) .............................. 2003-110097

(51) Int. Cl.
*H01L 29/06* (2006.01)
(52) U.S. Cl. .................. 257/26; 257/565; 257/E21.395
(58) Field of Classification Search ................. 438/235; 257/197, E29.189, E29.192, E29.241, 9, 257/14, 21, 26, 29, 565, 615, E21.395
See application file for complete search history.

(56) References Cited

U.S. PATENT DOCUMENTS

| | | | | |
|---|---|---|---|---|
| 5,693,180 A | * | 12/1997 | Furukawa et al. | 438/720 |
| 5,844,253 A | * | 12/1998 | Kim et al. | 257/24 |
| 6,576,932 B2 | * | 6/2003 | Khare et al. | 257/103 |
| 6,741,623 B2 | * | 5/2004 | Ishikawa et al. | 372/45.01 |
| 6,765,242 B1 | * | 7/2004 | Chang et al. | 257/197 |
| 7,026,182 B2 | * | 4/2006 | Ishikawa et al. | 438/44 |
| 2003/0064538 A1 | * | 4/2003 | Fujimoto | 438/48 |

FOREIGN PATENT DOCUMENTS

| | | |
|---|---|---|
| JP | 03-241868 | 10/1991 |
| JP | 11-261404 | 9/1999 |
| JP | 2002-289529 | 10/2002 |
| JP | 2004-103888 | 4/2004 |

OTHER PUBLICATIONS

Chiu et al.; "Base Transit in Abrupt GaN/InGaN/GaN HBT's"; *IEEE Transactions on Electron Devices*; vol. 47, No. 4; pp. 662-666; c. 2000.

* cited by examiner

*Primary Examiner*—Thanh V Pham
*Assistant Examiner*—Khiem D Nguyen
(74) *Attorney, Agent, or Firm*—McDermott Will & Emery LLP (57) ABSTRACT

A ballistic semiconductor device of the present invention comprises a n-type emitter layer (102), a base layer (305) made of n-type InGaN, a n-type collector layer (307), an emitter barrier layer (103) interposed between the emitter layer (102) and the base layer (305) and having a band gap larger than that of the base layer (305), and a collector barrier layer (306) interposed between the base layer (305) and the collector layer (307) and having a band gap larger than that of the base layer (305), and operates at 10 GHz or higher.

16 Claims, 9 Drawing Sheets

BALLISTIC SEMICONDUCTOR DEVICE

TECHNICAL FIELD

The present invention relates to a ballistic semiconductor device and, more particularly to a hot electron transistor.

BACKGROUND ART

Several semiconductor devices have been proposed as a hot electron transistor (HET) using hot electrons. A first prior art is a resonant-tunneling hot electron transistor device (RHET) proposed by Yokoyama et al. (see Japanese Journal of Applied Physics Letters, Vol. 24, No. 11, p. L853, (1985))

FIG. 11 and FIGS. 12(a), 12(b), and 12(c) are views showing a device structure and a principle of operation shown in FIGS. 1 and 3 of the cited reference by Yokoyama et al. In the first prior art, after an AlGaAs layer 21 is grown on a $n^+$-GaAs substrate 20 to be 300 nm thick, a Si doped $n^+$-GaAs layer 22, an AlGaAs barrier layer 23, a GaAs well layer 24, an AlGaAs barrier layer 25, and a Si doped $n^+$-GaAs layer 26 are grown to be 100 nm, 5 nm, 5.6 nm, 5 nm, and 50 nm, respectively.

The first prior art comprises a resonant-tunneling structure within an emitter region of the HET, and a device operation at 77K has been reported. The operation is as follows. When a base 12 and an emitter 14 are equipotential, electron energy of the emitter is lower than a quantum level (E1) of a quantum well 13 provided between the emitter 14 and the base 12 as shown in FIG. 12(a), so that no current flows through the emitter.

Figure 12:
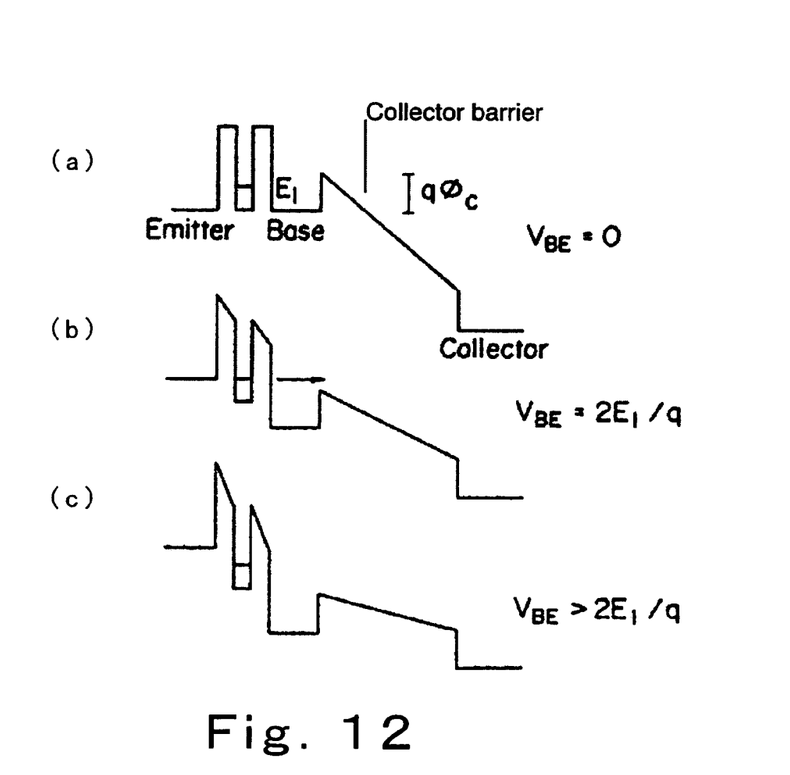
FIGS. 12(a), 12(b), and 12(c) are views schematically showing a principle of operation of the ballistic semiconductor device according to the first prior art.

Upon a voltage being applied between the base and the emitter, the electron energy of the emitter conforms to the quantum level of the quantum well as shown in FIG. 12(b), thereby generating a resonant-tunneling effect.

More specifically, the electron energy of the emitter has a certain distribution, and, only electrons having energy that conforms to the quantum level are emitted to the base by the resonant-tunneling effect. Since the emitted electrons have high energy, they pass through the base layer at a high speed substantially without scattering (ballistic conduction), go over an energy barrier (q$\Phi$c) between a base layer and a collector barrier layer, and are injected into the collector barrier layer.

The injected electrons travel through the collector barrier layer substantially without scattering, and reach a collector layer. Since the electrons are not substantially scattered throughout the above-described process, it is expected that the device operates at a speed higher than that of a general transistor device depending on scattering and diffusion.

However, the first prior art has a problem that an operating temperature is limited at a room temperature, device gain is small, and an operation speed is not so high as expected. For example, in the first prior art, operation at 77K is reported, but the operation at a room temperature and improvement of the operation speed is not described.

Accordingly, an InP based HET operating at a room temperature (second prior art) has been reported (see IEEE Electron Device Letters, Vol. 14, No. 9, pp. 441-443, September, (1993)).

However, the second prior art has a problem that the device gain is smaller than that of a general transistor, and the operation speed is not especially high.

LIST OF PRIOR ART REFERENCES CONCERNING THE PRESENT INVENTION (1) Naoki Yokoyama et al., "A New Functional, Resonant-Tunneling Hot Electron Transistor (RHET)", Japanese Journal of Applied Physics Letters, Vol. 24, No. 11, pp. L853-L854 (1985)

(2) Theodore S. Moise, "Room-Temperature Operation of a Resonant-Tunneling Hot-Electron Transistor Based Integrated Circuit", IEEE ELECTRON DEVICE LETTERS, Vol. 14, No. 9, (September 1993)

(3) U.S. Pat. No. 5,389,798 (UK Patent No. GB2260858, and Japanese Laid-Open Patent Application Publication No. H5-190834 (especially, the paragraph [0045]))

(4) Japanese Laid-Open Patent Application Publication No. 2002-305204

(5) Yoshiaki Sano et al., "High Frequency Transistor Supporting Information-Communication Technology of the Next Generation", Oki Technical Review 185, Vol. 68, No. 1, pp. 118-121, (January 2001) (this discloses that, since GaN has a wide band gap, the device can operate at a temperature (approximately 300° C.) higher than those of GaAs and Si)

DISCLOSURE OF THE INVENTION

The present invention is aimed at solving the above-described problem. And an object of the present invention is to provide a novel semiconductor device having a large gain and configured to operate at a high speed in a wide temperature range (not lower than 80° C. and not higher than 200° C.).

In order to achieve the above object, according to the present invention, there is provided a ballistic semiconductor device comprising a n-type emitter layer, a base layer made of n-type InGaN, a n-type collector layer, an emitter barrier layer interposed between the emitter layer and the base layer and having a band gap larger than a band gap of the base layer, and a collector barrier layer interposed between the base layer and the collector layer and having a band gap larger than the band gap of the base layer, wherein the ballistic semiconductor device operates at 10 GHz or higher. In such a configuration, ratio of electrons which ballistically conduct between the base and the collector to electrons emitted from the emitter barrier layer is improved, thereby improving current gain and operation speed. And, scattering of electrons which ballistically conduct due to phonon is inhibited, thereby improving Ion/Ioff ratio. Consequently, the ballistic semiconductor device can operate as a switching device or an amplifying device at a high frequency of 10 GHz or higher.

Concentration of In contained in the base layer is preferably not less than 0.1% and not more than 5%.

The collector barrier layer may be made of AlInGaN.

Concentration of In contained in the collector barrier layer is preferably not less than 0.1% and not more than 5%.

The collector layer may be made of InGaN.

Concentration of In contained in the collector layer is preferably not less than 0.1% and not more than 5%.

The collector barrier layer may be made of AlInGaN, and the collector layer may be made of InGaN.

Concentration of In contained in the base layer, concentration of In contained in the collector barrier layer, and concentration of In contained in the collector layer are each preferably not less than 0.1% and not more than 5%.

The emitter barrier layer may be formed by an AlGaN layer which contacts both the emitter layer and the base layer.

The AlGaN layer may be formed by a layered structure of a n-type AlGaN layer and an undoped AlGaN layer.

The n-type AlGaN layer may contact the emitter layer, and the undoped AlGaN layer may contact the base layer.

The ballistic semiconductor device may comprise two or more of the emitter barrier layers, and a quantum well layer may be interposed between two adjacent emitter barrier layers.

The quantum well layer may be made of InGaN. In such a configuration, the operation speed becomes higher by making a half bandwidth of energy level of permeability coefficient three times larger, thereby achieving a THz operation.

Concentration of In contained in the quantum well layer is preferably not less than 10% and not more than 30%. In such a configuration, a domain with a high In concentration may be formed in a quantum dot shape.

The quantum dot may be formed in the quantum well layer. In such a configuration, high-speed operation in a wide range can be achieved.

A width of the quantum dot seen from a thickness direction of the quantum well layer is preferably not less than 1 nm and not more than 100 nm.

The object, as well as other objects, features and advantages of the present invention will become more apparent from the following detailed description of the preferred embodiments taken with reference to the accompanying drawings.

BRIEF DESCRIPTION OF THE DRAWINGS

FIGS. 3(a), 3(b), and 3(c) are views showing an energy distribution of emitted electrons, in which

FIGS. 7(a) and 7(b) are conceptual views showing energy band structures and transmissivity of the ballistic semiconductor device, in which

FIGS. 8(a) and 8(b) are views showing quantum dots, in which

BEST MODE FOR CARRYING OUT THE INVENTION

Hereinafter, embodiments of the present invention will be described with reference to the drawings.

A ternary mixed crystal material made of InGaN is used as a semiconductor composing a ballistic semiconductor device of the present invention. And, a semiconductor substrate comprising GaN, a sapphire substrate and a silicon substrate each having a lattice constant near to that of the GaN substrate, an insulative substrate and the like may be used as a substrate of the ballistic semiconductor device of the present invention. Hereinafter, specific examples will be described.

First Embodiment

According to a first embodiment of the present invention, there is provided a novel ballistic semiconductor device which is easy to fabricate, and operates at a high speed in a wide temperature range, as compared to the conventional ballistic semiconductor device.

Figure 1:
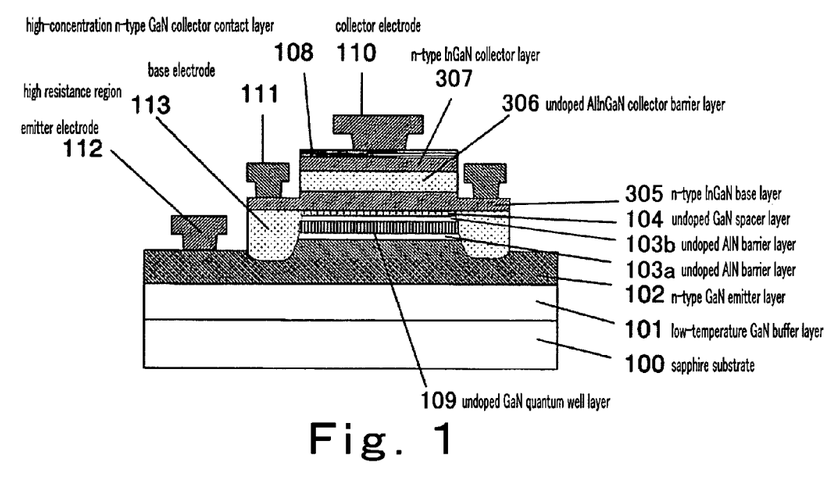
FIG. 1 is a cross-sectional view showing a cross-sectional structure of a ballistic semiconductor device according to a first embodiment of the present invention.

FIG. 1 is a cross-sectional view showing an example of a cross-sectional structure of the ballistic semiconductor device according to this embodiment. The ballistic semiconductor device according to this embodiment is a RHET. This ballistic semiconductor device comprises a sapphire substrate 100. On the sapphire substrate 100, a low-temperature GaN buffer layer (with a film thickness d=100 nm) 101, a n-type GaN emitter layer (with a carrier concentration n=$10^{18}$ cm$^{-3}$, d=1 μm) 102, an undoped AlN barrier layer 103a, an undoped GaN quantum well layer 109, an undoped AlN barrier layer 103b, an undoped GaN spacer layer 104, a n-type InGaN base layer (n=$10^{18}$ cm$^{-3}$) 305, an undoped AlInGaN collector barrier layer 306, a n-type InGaN collector layer (n=$10^{18}$ cm$^{-3}$, d=0.5 μm) 307, and a high-concentration n-type GaN collector contact layer (n=$5\times10^{18}$ cm$^{-3}$, d=0.5 μm) 108 are sequentially formed. In the present invention, since it is required that electrons emitted from the emitter layer 102 reach the collector layer 307, each of the emitter layer 102, the base layer 305, and the collector layer 307 is n doped. Therefore, the present invention is not a so-called bipolar transistor, but a monopolar transistor. When the undoped AlN barrier layer 103a and the undoped AlN barrier layer 103b are to be distinguished from each other, they are referred to as a first undoped AlN barrier layer 103a and a second undoped AlN barrier layer 103b.

The GaN quantum well layer 109 is interposed between a pair of AlN barrier layers 103a and 103b in a vertical direction (thickness direction), and the GaN quantum well layer 109 and the pair of AlN barrier layers 103a and 103b form a resonant-tunneling structure. An amount of In added to the base layer 305, to the collector barrier layer 306, and to the collector layer 307 is preferably not less than 0.1% and not more than 5%, and more preferably, approximately 2%. The reason for this and an effect of adding In will be described in detail below.

The emitter layer 102, the pair of AlN barrier layers 103a and 103b, and the GaN quantum well layer 109 form an emitter, the InGaN base layer 305 forms a base, and, the collector barrier layer 306 and the InGaN collector layer form a collector. A collector electrode 110 is provided on the collector contact layer 108. A base electrode 111 and an emitter electrode 112 are provided on an exposed region of the base layer 105 and an exposed region of the emitter layer 102, respectively. Furthermore, a high resistance region 113 is provided on a portion of the layers interposed between the base layer 105 and the emitter layer 102, which is located under the exposed region of the base layer 105. The high resistance region 113 may be provided by ion implantation, by selective etching of a mesa side surface, by selective oxidation and the like.

Film thickness of the AlN barrier layers 103a and 103b is 1.5 nm, and that of the GaN quantum well layer 109 is 2.5 nm.

And, film thickness of the base layer 305 and that of the collector barrier layer 106 are each set to 50 nm in this embodiment.

Next, a method of fabricating the above-structured ballistic semiconductor device will be described.

First, a GaN substrate is formed by carrying out steps described below by employing a MOVPE process.

The low-temperature GaN buffer layer 101 is grown to be 100 nm thick on the sapphire substrate 100, having (0001) surface as a principal surface, at a temperature of 530° C., and then a temperature is increased up to 1050° C. and the undoped GaN layer is grown to be 2 μm thick. Thereafter the n-type GaN emitter layer 102 is grown to be 1 μm thick by Si doping. In this manner, the GaN substrate is formed. A growth speed is set to 0.5 μm/h to allow the substrate to have rippled surface. As described later, the GaN substrate may be replaced by a substrate formed in a manner in which a GaN layer is grown on a GaAs substrate or the like, then the GaAs substrate is removed to form a GaN substrate 200 comprising the GaN layer, and, a defect reduction layer 201 comprising a super lattice structure of AlGaN and GaN and an undoped GaN layer are grown on the GaN substrate 200 (See FIG. 5). Next, the GaN substrate is introduced into an MBE device equipped with a RF nitrogen plasma source, and epitaxial growth of mixed crystal for HET is performed. III-group element and Si are fed as solid sources. N atom is fed by cracking nitrogen gas by using a RF nitrogen plasma cell. Plasma output is set to 350 W and 3 ccm to 20 ccm of nitrogen is fed. A growth temperature of GaN and AlN is set to 720° C.

Specifically, a surface of the GaN substrate is annealed in nitrogen atmosphere at a temperature of 950° C. for improving surface flatness, and then the n-type GaN emitter layer 102 is grown with a thickness of 1 μm to provide 2 μm thickness in total.

Following this, the first undoped AlN barrier layer 103a, the undoped GaN quantum well layer 109, the second undoped AlN barrier layer 103b, the undoped GaN spacer layer 104, the n-type InGaN base layer (n=$10^{18}$ cm$^{-3}$) 305, the undoped AlInGaN collector barrier layer 306, the n-type InGaN collector layer (n=$10^{18}$ cm$^{-3}$, d=0.5 μm) 307, and the high-concentration n-type GaN collector contact layer (n=5× $10^{18}$ cm$^{-3}$, d=0.5 μm) 108 are sequentially grown. When the GaN layer and the InGaN layer are grown, Ga, In and N are fed simultaneously. Growth speed is set to 1 μm/h. When the AlN layer is grown, Al and N-atom are separately fed by time division, because the AlN layer grows three-dimensionally due to large distortion. The growth speed is set to 0.2 μm/h.

Next, a method of forming a transistor structure will be described.

First, in a base forming process, layers from the n-type InGaN collector layer 307 to the n-type GaN base layer 305 are etched by chlorinated dry etching in a shape of a square, the sides of which are each 25 μm. Then, in a resistance increasing step, Ar or high-concentration Si is injected into the region located below the base layer 305, thereby producing the high resistance region 113.

Then, in a first electrode forming process, Ti/Al electrodes are EB evaporated on the high-concentration n-type GaN collector contact layer 108 and on an etched surface of the n-type GaN base layer 305, by a lift-off process using an oxide film and a resist, to form the collector electrode 110 and the emitter electrode 111, respectively. Then, in an emitter forming process with an emitter region and a base region protected by an insulative film, layers to the n-type GaN emitter layer 102 are etched by chlorinated dry etching in a shape of a square, the sides of which are each 50 μm. Then, in a second electrode forming process, the Ti/Al electrode is EB evaporated on a surface of the n-type GaN emitter layer 102 to form the emitter electrode 112, by the lift-off process using the oxide film and the resist. Next, in a device isolation process with an entire device covered with the insulative film, layers to the GaN substrate 100 (or the sapphire substrate) are removed by etching. In this manner, the transistor structure was formed.

Next, to describe an operation of the ballistic semiconductor device of the present invention, a cause by which the device in the prior arts do not operate in a room temperature is described by taking the second prior art as an example.

In the second prior art, as described above, there has been a problem that device gain is small and operation speed is not so high as expected. And, it has been revealed that the major cause thereof is energy distribution of electrons emitted from the emitter.

To describe the cause, a ballistic semiconductor device comprising the RHET using GaN is fabricated as a comparative example.

Figure 2:
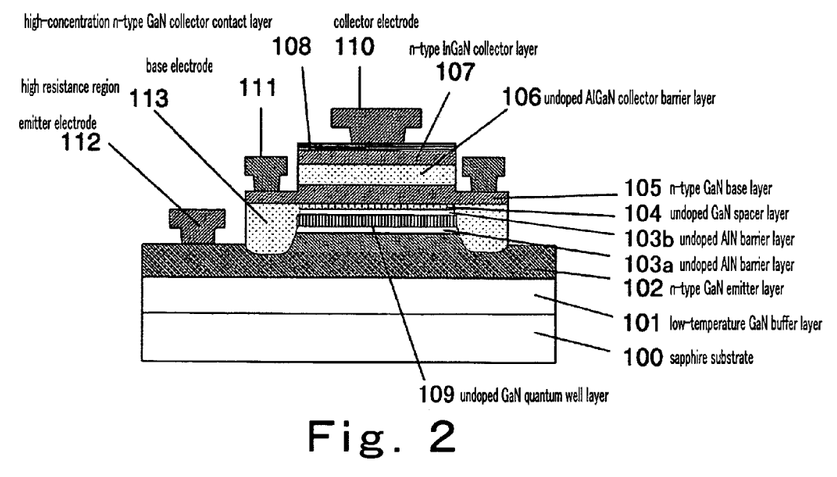
FIG. 2 is a cross-sectional view showing a cross-sectional structure of a ballistic semiconductor device according to a comparative example of the first embodiment of the present invention.

FIG. 2 is a cross-sectional view showing a structure of the comparative example. As shown in FIG. 2, in the comparative example, a base layer 105 is formed by a n-type GaN layer, a collector barrier layer 106 is formed by an undoped AlGaN layer, and a collector layer 107 is formed by the n-type GaN layer. Other configuration is identical to that of the ballistic semiconductor device according to this embodiment shown in FIG. 1.

And, the second prior art includes an $In_{0.53}Ga_{0.47}As$ base layer and an $In_{0.1}Ga_{0.9}P$ collector barrier layer formed on the InP substrate. Hereinafter, material composition of the second prior art is referred to as InP based composition.

As shown in FIG. 3(a), in general, in the RHET (herein, the comparative example is taken as an example), a resonant-tunneling condition between the emitter and the base is that z-directional components (as used herein, z-direction is a direction perpendicular to the quantum well layer 109) of electron energy substantially conform to a quantum level (E1) of the quantum well layer 109. That is, z-directional components of the energy of electrons having passed the quantum well layer 109 substantially conform to E1, but the magnitude of energy is not limited as indicated by E2 when this includes x-directional energy components and y-directional energy components. Consequently, the total energy of electrons (the sum of x components, y components, and z components) has distribution according to thermal energy and a voltage between the emitter and the base. Since spread of the energy distribution is small under a low temperature, the spread of energy in x direction and energy in y direction is also small, but the distributions thereof spread as indicated by numeral 403 in FIG. 3(b), as the temperature rises.

FIG. 3(b) shows the energy distribution of electrons emitted from the quantum well layer to the base layer at a room temperature, in the RHET of the second prior art. A low-energy region (hatched area on the left side) 401 is a region in which because of its low electron energy, the electrons travel at a low speed, and thereby are scattered in the base layer 305 and in the collector barrier layer 308. And a high-energy region (hatched area on the right side) 402 is a region in which because of its high electron energy, the electrons are scattered due to Γ-L intervalley transition within the semiconductor, thereby lowering their speed. Therefore, only electrons having energy condition not less than that of the low-energy region 401 and not more than that of the high-energy region 402 can ballistically conduct.

Figure 3:
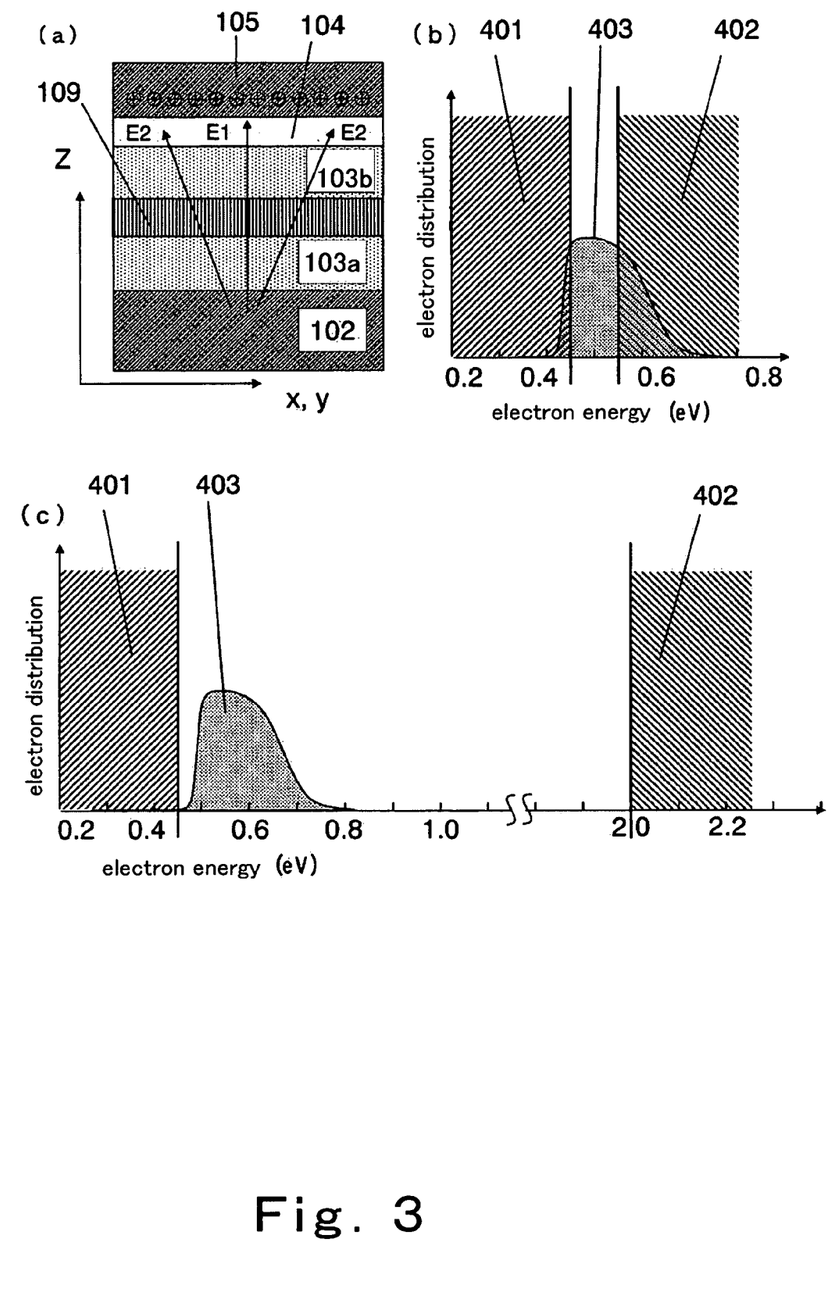
FIG. 3(a) is a view schematically showing directional components of energy of electrons emitted from the emitter.
FIG. 3(b) is a view schematically showing an electric energy distribution in a second prior art.
FIG. 3(c) is a view schematically showing the electric energy distribution in the comparative example.

Both the low-energy region 401 and the high-energy region 402 depend on a device structure and a semiconductor material. When it is estimated about the RHET of the second prior art, peak energy of the energy distribution 403 of electrons emitted from the quantum well layer should be set approximately 0.5 eV to maximize a density of electrons which ballistically conduct, as shown in FIG. 3(*b*). Consequently, the electron energy distribution 403 spreads within both the low-energy region 401 and the high-energy region 402 as indicated by a solid line.

This is because the electron energy distribution 403 spreads due to thermal effect or the like. If the energy of the quantum level is lowered, components of the high-energy region 402 can be decreased, but components of the low-energy region 401 are adversely increased. Consequently, even in the best condition, approximately 60% of entire electron energy distribution is distributed within the low-energy region 401 or the high-energy region 402, and percentage of electrons which can actually pass between the base and the collector at a high speed is no more than approximately 40%.

And, when the voltage between the base and the emitter is modulated in high frequency operation, an amount of emitted electrons changes, but increases and decreases slowly due to wide distribution of the electron energy. In this case, a shape of the distribution of the electron energy varies, and a peak of the distribution also varies due to variation in quantum level according to a variation in the voltage between the base and the emitter. Consequently, it becomes very difficult to keep the peak of the emitted electron energy within an energy region in which the electrons can travel at a high speed, over an entire region of modulation, and thereby, the percentage of electrons traveling at a high speed is further decreased. When low-speed electrons are large in number as compared to electrons capable of high speed travel, the response speed of the entire device becomes slow due to a delay time of the low-speed electrons.

And, when the low-speed electrons are scattered, an electron temperature and a lattice temperature in the vicinity thereof increase, thereby further increasing electron scattering probability. And, part of scattered electrons slow down, and travel time thereof becomes long. In addition, they lose energy and thereby can not go over a barrier between the base layer and the collector barrier layer. Consequently, base current increases, and ratio of collector current to the base current, that is, current gain is also deteriorated.

On the other hand, in the comparative example, an energy interval between the low-energy region 401 and the high-energy region 402 can be increased as shown in FIG. 3(*c*) by using a GaN based semiconductor material. Since Z direction along which the electrons flow conforms to C-axis direction in a nitride based semiconductor formed by hexagonale, this is A-direction in a symmetrical notation. In this case, difference in conduction band energy between Γ point and A point is 2 eV, which is approximately four times as large as 0.55 eV in the case of the InP based second prior art. Consequently, no electrons exist within the high-energy region.

Furthermore, it becomes possible to increase the peak of the electron energy distribution from 0.5 eV to 0.6 eV, and thereby, no electrons exist within the low-energy region 401. From these results, it has been found that the percentage of electrons that ballistically conduct between the base and the collector is improved up to approximately 80%, by setting the peak of the electron energy distribution to 0.5 eV. It is required to reduce a film thickness of the quantum well layer 109 from 3 nm to 2.5 nm so as to increase the peak of the electron distribution from 0.5 eV to 0.6 eV. Consequently, density of electrons existing within the low-energy region 401 lowers, and the percentage of electrons that ballistically conduct between the base and the collector is improved up to approximately 95%.

Furthermore, it has been found that by reducing the thickness of the quantum well layer 109 to 2 nm, the peak of the electron distribution becomes 0.8 eV, and the percentage of electrons which ballistically conduct between the base and the collector is improved up to approximately 99%. But, since film thickness controllability during crystal growth is deteriorated as the quantum well layer 109 becomes thinner, the thickness of the quantum well layer 109 is set to 2.5 nm in the comparative example (also in the RHET according to the present embodiment).

Figure 4:
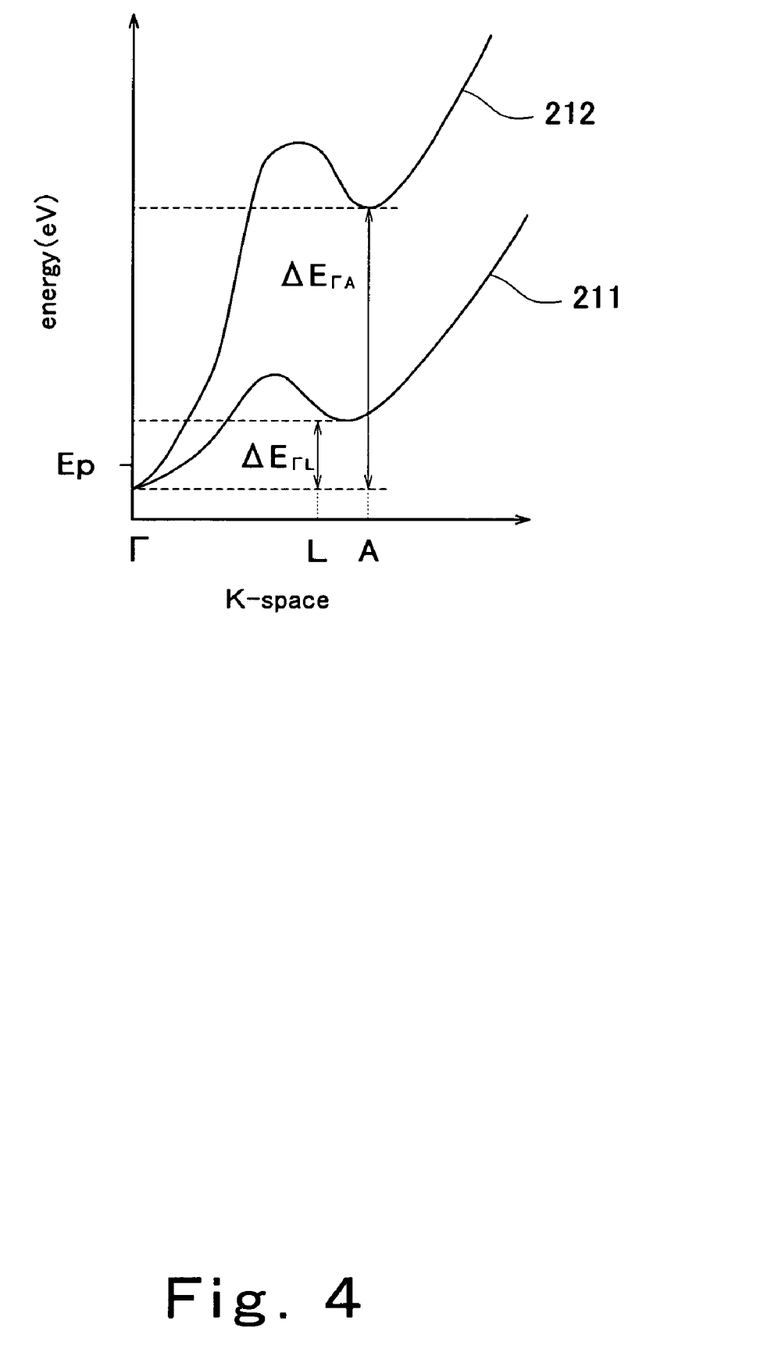
FIG. 4 is a view showing band structures of the second prior art and the comparative example.

FIG. 4 is a view showing band structures of GaN and InGaAs. In FIG. 4, an abscissa axis and an ordinate axis represent K space and energy, respectively. And, reference numeral 211 represents the band structure of InGaAs composing the base layer of the second prior art, and reference numeral 212 represents the band structure of GaN composing the base layer of the comparative example. As described above, in GaN, an energy difference $\Delta E_{\Gamma A}$ between the point Γ and the point A becomes considerably larger than an energy difference $\Delta E_{\Gamma L}$ between the point Γ and the point L in InGaAs. So, it has been found that in the comparative example, the percentage of electrons which ballistically conduct between the base and the collector is improved as compared to the second prior art, thereby improving the current gain and the operation speed.

However, from study of the inventors of the present invention, it has been revealed that the electrons which ballistically conduct, which have been said to be unsusceptible of phonon scattering, are subjected to the phonon scattering, and such phenomenon is noticeable especially in GaN. That is, it has been proved that, in InGaAs, since influence of the above-described Γ-A intervalley transition on the operation speed of the device is noticeable, influence of the phonon scattering is not noticeable. However, since in GaN, the Γ-L intervalley transition does not substantially affect the operation speed of the device, influence of the phonon scattering becomes noticeable, and electrons are easily subjected to the phonon scattering in GaN in terms of a material. As used herein, the phonon scattering means a phenomenon in which the electrons are scattered in consonance with lattice vibration of a substance when the electrons travel within the substance.

In FIG. 4, the phonon scattering occurs when the electrons have energy not less than certain energy (hereinafter, referred to as phonon scattering energy) $E_P$. In the case of GaN, the phonon scattering energy $E_P$ is approximately 0.3 V. Therefore, as appreciated from FIG. 3(*c*), in the case of GaN, the percentage of electrons which ballistically conduct between the base and the collector is improved as compared to the second prior art, but the electrons which ballistically conduct are subjected to the phonon scattering. In FIG. 2, when the electrons which ballistically conduct the base layer 105 are scattered, the electron energy is lowered, and thereby the electrons do not reach the collector layer 107. So, the electrons become the base current and Ioff value increases. Consequently Ion/Ioff ratio is decreased. Ion is a first peak value of the flowing current from a point at which the current starts to flow, and Ioff is a minimum value of the decreasing current after the peak. Accordingly, in a GaN based ballistic semiconductor device, a thickness of the base layer (approximately 50 nm) may be reduced to one-tenth thereof (approximately 5 nm), for inhibiting such scattering. However, if the base layer made of GaN is made thinner, the base resistance increases in inverse proportion to the thickness, thereby significantly increasing base resistance (specifically, ten times or larger). Consequently, the inventors of the present invention found a problem that the GaN based ballistic semiconductor device can not operate at a high speed (2 to 3 GHz at maximum) as a switching device or an amplifying device.

Accordingly, in order to solve the problem, from intensive study by the inventors, it has been found that by forming the base layer 305 using InGaN, the GaN based ballistic semiconductor device can operate as the switching device or the amplifying device at a high frequency of 10 GHz or higher, thus achieving the present invention.

As used herein, the fact that the semiconductor device operates at 10 GHz or higher means that at least one of the current flowing through the base layer and the voltage applied to the base layer is an alternating current of 10 GHz or higher when the emitter layer is grounded (emitter ground), or at least one of the current flowing through the emitter layer and the voltage applied to the emitter layer is the alternating current of 10 GHz or higher when the base layer is grounded (base ground). The upper limit of the current is 10 THz or lower.

In such a configuration, the scattering of electrons due to the phonon is inhibited by a reason described below, thereby improving the Ion/Ioff ratio.

Specifically, by adding In to GaN or AlGaN, a lattice interval of a portion in which In exists becomes smaller. In addition, since In is easily segregated, portions with small lattice interval are distributed unevenly in GaN or AlGaN of bulk. Consequently, vibration mode of phonon of bulk becomes more than one, and varies from region to region. As a result, the electrons hardly resonate the phonon of bulk, and occurrence of the electron scattering is inhibited. When an adding amount (concentration) of In is less than 0.1%, effect of adding In tends to be inadequate, while when an adding amount of In is more than 5.0%, the electron scattering tends to increase due to local variation of the In concentration. Therefore, the adding amount of In is preferably not less than 0.1% and not more than 5.0%, more preferably, approximately 2%. It is needless to say that the current gain and the operation speed are improved as in the comparative example even when In is added.

And, in connection with the fact that the base layer 305 is formed by InGaN, the collector barrier layer 306 and the collector layer 307 are preferably formed by an undoped AlInGaN layer and the n-type InGaN collector layer, respectively. The amount of In contained in the collector barrier layer 306 and the collector layer 307 is preferably not less than 0.1% and not more than 5.0%, for the same reason as described above.

As described above, in the ballistic semiconductor device according to this embodiment, since the base layer 305 is formed by the n-type InGaN layer including In of not less than 0.1% and not more than 5.0%, ratio of electrons which ballistically conduct between the base and the collector to electrons emitted from the emitter is improved, thereby improving the current gain and the operation speed, and, occurrence of phonon scattering of electrons which ballistically conduct is inhibited, thereby improving the Ion/Ioff ratio.

Operation of the ballistic semiconductor device of the present invention as the switching device is substantially identical to that of the first prior art. That is, when the base layer 305 and the emitter layer 102 are equipotential, the electron energy of the emitter layer 102 is lower than the quantum level (E1) of the GaN quantum well layer 109 interposed between the pair of AlN barrier layers 103a and 103b, so that the electrons do not travel from the emitter layer 102 to the base layer 305. Therefore, when the base layer 305 and the emitter layer 102 are equipotential, the device is in "off-state".

Upon a voltage being applied between the base layer 305 and the emitter layer 102, the electron energy of the emitter layer 102 conforms to the quantum level of the GaN quantum well layer 109, thereby generating the resonant-tunneling effect. In other words, only the electrons having energy that conforms to the quantum level of the GaN quantum well layer 109, which are included in the electrons of the emitter layer 102 spreading to have a certain distribution, are emitted to the base layer 305 by the resonant-tunneling effect. Since the emitted electrons have high energy, they pass through the base layer 305 at a high speed substantially without scattering (ballistic conduction), go over the energy barrier (q$\Phi$c) between the base layer 305 and the collector barrier layer 306, and are injected into the collector barrier layer 307. Therefore, upon the voltage being applied between the base layer 305 and the emitter layer 102, the device is in "on-state".

The electrons travel substantially without scattering through the collector barrier layer 307 and reach the collector layer 307. Since the electrons are not substantially scattered throughout the above-described process, they operate at a higher speed as compared to that of a general transistor device depending on the scattering and the diffusion.

Second Embodiment

In a second embodiment of the present invention, the collector layer 107 is first formed on the GaN substrate. In the first embodiment, the barrier layers 103a and 103b and the quantum well layer 109 each forming the resonant-tunneling structure are required to have uniform film thickness and flatness. Therefore, the resonant-tunneling structure is first formed on the GaN substrate. But in order to reduce parasitic capacitance or the like, the emitter is preferably smaller.

Accordingly, in this embodiment, the collector is first formed on the GaN substrate.

Figure 5:
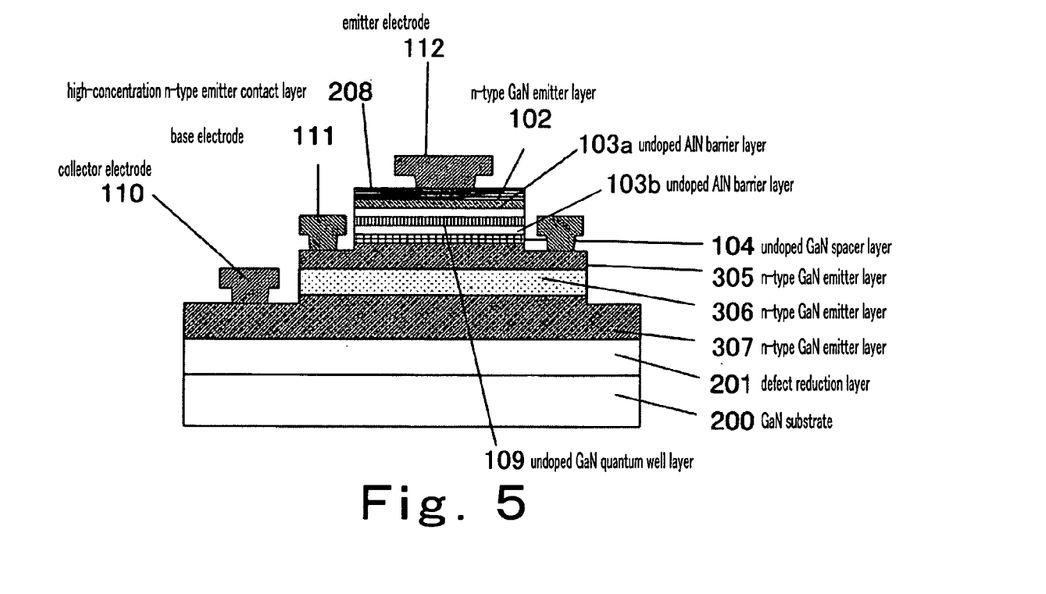
FIG. 5 is a cross-sectional view showing a cross-sectional structure of a ballistic semiconductor device according to a second embodiment of the present invention.

FIG. 5 is a cross-sectional view showing a cross-sectional structure of a ballistic semiconductor device according to this embodiment. In FIG. 5, the same reference numerals as those in FIG. 1 denote same or corresponding portions.

As shown in FIG. 5, in the ballistic semiconductor device of this embodiment, the defect reduction layer 201 comprising the AlGaN/GaN super lattice structure, the n-type InGaN collector layer 307, the undoped AlInGaN collector barrier layer 306, the n-type InGaN base layer 305, the undoped GaN spacer layer 104, the undoped AlN barrier layer 103b, the undoped GaN quantum well layer 109, the undoped AlN barrier layer 103a, the n-type GaN emitter layer 102, and a high-concentration n-type GaN emitter contact layer (n=5× $10^{18}$ cm$^{-3}$, d=0.5 µm) 208 are sequentially formed on the GaN substrate 200.

The GaN quantum well layer 109 is interposed between the pair of AlN barrier layers 103a and 103b in a vertical direction (thickness direction), and the GaN quantum well layer 109 and the pair of AlN barrier layers 103a and 103b form the resonant-tunneling structure.

The emitter electrode 112 is provided on the emitter layer 102. The base electrode 111 and the collector electrode 110 are provided on an exposed region of the base layer 305 and an exposed region of the collector contact layer 108, respectively. Film thickness and carrier concentration are identical to those of the first embodiment.

Next, a method of fabricating the above-structured ballistic semiconductor device according to this embodiment will be described.

The GaN layer is grown on the GaAs substrate or the like, and then the GaAs substrate is removed to form the GaN substrate 200 comprising the GaN layer. And, the defect reduction layer 201, the undoped GaN layer, and the n-type InGaN collector layer 307 are sequentially formed on the GaN substrate 200 by employing the MOVPE process. Specifically, 30 periods of the super lattice structures of AlGaN and GaN, each 10 nm thick, are grown at a temperature of 1050° C. to form the defect reduction layer 201, and an undoped InGaN layer is grown thereon to be 2 μm thick. Thereafter, the n-type InGaN collector layer 307 is grown to be 1 μm thick by Si doping. A growth speed is set to 0.5 h to allow the substrate to have rippled surface.

The GaN substrate 200 on which the above-described layers are formed is introduced into the MBE device equipped with the RF nitrogen plasma source, and the epitaxial growth of mixed crystal for HET is performed. A growth condition and sequence are identical to those of the first embodiment. The surface of the GaN substrate is annealed in nitrogen atmosphere at a temperature of 950° C. for improving surface flatness, and then the n-type InGaN collector layer 307 is grown with a thickness of 1 μm to provide 2 μm thickness in total. Following this, the undoped AlInGaN collector barrier layer 306, the n-type InGaN base layer 305, the undoped GaN spacer layer 104, the undoped AlN barrier layer 103b, the undoped GaN quantum well layer 109, the undoped AlN barrier layer 103a, the n-type GaN emitter layer 102, and the high-concentration n-type GaN emitter contact layer 208 are sequentially grown. A growth condition of the MBE process is identical to that of the first embodiment.

Next, a method of forming a transistor structure will be described.

First, in the base forming process, layers from the high-concentration n-type GaN emitter contact layer 208 to the n-type GaN base layer 105 are etched by chlorinated dry etching in a shape of a square, the sides of which are each 25 μm. Then, in the first electrode forming process, the Ti/Al electrodes are EB evaporated on the emitter contact layer 208 and on an etched surface of the n-type GaN base layer 105 to form the emitter electrode 112 and the base electrode 111, respectively, by the lift-off process using the oxide film and the resist. Then, in a collector forming process, with the emitter region and the base region protected by the insulative film, layers to the n-type GaN collector layer 307 are etched by chlorinated dry etching in a shape of a square, the sides of which are each 50 μm. Then, in the second electrode forming process, the Ti/Al electrode is EB evaporated on a surface of the collector layer 307 to form the collector electrode 110 by the lift-off process using the oxide film and the resist. Next, in the device isolation process, with an entire ballistic semiconductor device covered with the insulative film, layers to the GaN substrate 200 are removed by etching. In this manner, the transistor structure was formed.

In this embodiment, in order to improve uniformity of the film thickness and flatness of the barrier layers 103 and the quantum well layer 109, the layers are grown such that atom migration is increased by reducing a crystal growth speed to approximately 80% of a regular speed and increasing a growth temperature by approximately 20° C. from a regular temperature. Consequently, the parasitic capacitance of the emitter is reduced, thereby improving the operation speed of the device by approximately 20%.

Third Embodiment

According to a third embodiment of the present invention, there is provided a novel ballistic semiconductor device capable of achieving amplification ratio larger than that of the first and second embodiments.

Figure 6:
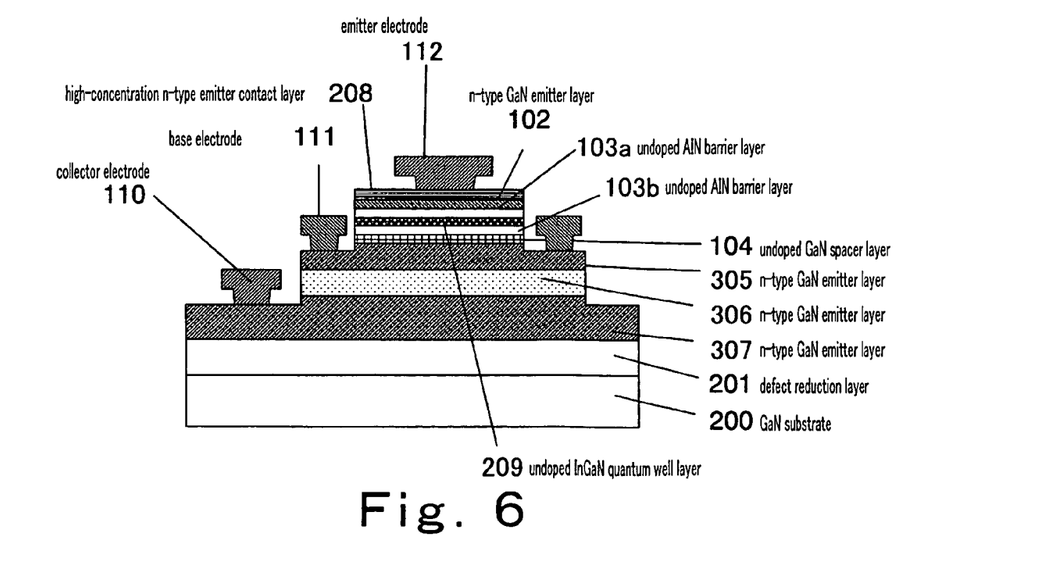
FIG. 6 is a cross-sectional view showing a cross-sectional structure of a ballistic semiconductor device according to a third embodiment of the present invention.

FIG. 6 is a cross-sectional view showing a cross-sectional structure of the ballistic semiconductor device according to this embodiment. In FIG. 6, the same reference numerals as those in FIG. 5 denote same or corresponding portions.

As shown in FIG. 6, in this embodiment, a quantum well layer 209 is formed by an undoped InGaN layer, unlike in the second embodiment in which the quantum well layer 109 is formed by the undoped GaN layer. Other configuration is identical to that of the second embodiment.

In the undoped InGaN quantum well layer 209, composition ratio (concentration) of In is not less than 10% and not more than 30%. The InGaN quantum well layer 209 is grown while simultaneously feeding In, Ga, and N. A growth speed is set to 0.1 μm/h, which is approximately equal to one tenth of that of a general GaN layer. When the composition ratio of In is 10%, the layer 209 can be grown at a growth temperature of 720° C. as in the case of the AlN barrier layers 103, while when the composition ratio of In is 30%, the growth temperature is decreased to 620° C. so as to inhibit re-vaporization of In. When the composition ratio of In is not more than 10%, this does not vary enough, and a quantum dot effect to be described below is not obtained. And, when the composition ratio of In is not less than 30%, lattice mismatch ratio increases, thereby significantly deteriorating flatness of the InGaN quantum well layer 209. Therefore, it has been proved that the composition ratio of In is preferably in a range of 10% to 30%.

When the quantum well layer 209 is formed by the InGaN layer, the following three effects are obtained.

First, since a band gap becomes smaller, it becomes possible to make the quantum well layer 209 thinner, and thereby a first level increases. So, transmission probability increases, thereby increasing the operation speed. Second, as a result of making the quantum well layer 209 thinner, a second level increases, thereby decreasing reactive current. Third, when the composition ratio of In is increased to approximately 30%, a region with a high In composition ratio is formed due to non-uniform composition, thereby causing the quantum dot effect to occur. Therefore, since not only Γ-A transition reduces but also the loss on the low-energy side reduces, the operation speed is improved. Also, a voltage is reduced.

First effect will be described with reference to FIGS. 7(a) and 7(b).

Figure 7:
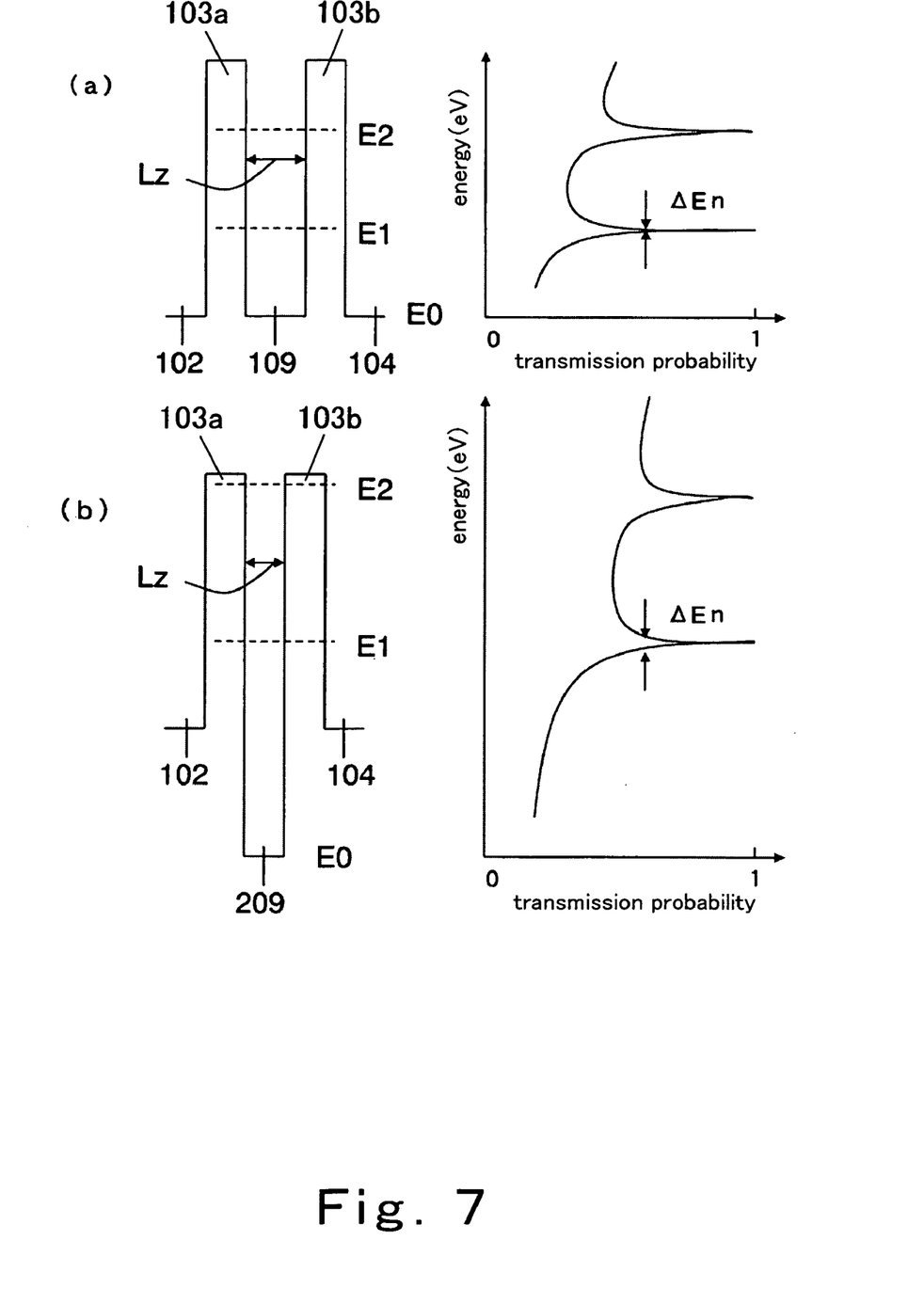
FIG. 7(a) shows a case of the ballistic semiconductor device according to the first embodiment.
FIG. 7(b) shows a case of the ballistic semiconductor device according to the third embodiment.

FIG. 7(a) shows a case where the GaN layer is used as the quantum well layer, and FIG. 7(b) shows a case where the InGaN layer is used as the quantum well layer. Conduction band energy decreases by approximately 0.3 eV when 10% of In is added, and by approximately 0.6 eV when 30% of In is added. In these cases, in order to minimize the loss on the low-energy side, a peak of an electron distribution is appropriately set to 0.6 eV, and for this purpose, film thickness Lz of the InGaN quantum well layer 209 is appropriately set to 1.8 nm when 10% of In is added, and to 1.6 nm when 30% of In is added.

That is to say, by making the InGaN quantum well layer 209 thinner, an energy difference $\Delta E1$ between a ground state E0 and a first level E1 is increased from 0.3 eV to 0.6 eV when 10% of In is added, and from 0.3 eV to 0.9 eV when 30% of In is added, in the case of the respective film thicknesses. An energy width $\Delta En$ of electron transmission coefficient increases from 0.4 meV to 1.2 meV, and thereby electron staying time becomes 0.6 ps according to the indeterminacy principle. Therefore, it has been proved that the device can operate at 1.7 THz. Actually, the device forming a circuit operates at the operation speed of approximately 1 THz under influence of the parasitic capacitance.

Next, the second effect will be described. Since an energy difference $\Delta E2$ between the ground state E0 and a second level E2 is four times as large as $\Delta E1$, $\Delta E1$ and $\Delta E2$ increase as the InGaN quantum well layer 209 is made thinner. Consequently, in order to make the second level E2 larger than an energy gap between the conduction band of the AlN barrier layers 103a and 103b, and that of the InGaN quantum well layer 209 so that the second level E2 does not exist within the InGaN quantum well layer 209, $\Delta E1$ is appropriately set to approximately 0.5 eV in the case of the InGaN quantum well layer 209, and a width of the InGaN quantum well layer 209 is appropriately set to 2 nm. And, when In is added in the composition ratio of 10% and 30%, $\Delta E1$ is appropriately 0.6 eV and 0.7 eV, respectively. So, it has been proved that this condition is satisfied when the In composition ratio is 10% and 30% as shown in the first effect.

Therefore, it has been proved that, since the second level is not formed within the InGaN quantum well layer 209 irrespective of composition ratio of In when the film thickness of the quantum well layer 209 is set to not more than 2 nm, no reactive current exists. In particular, since the energy level of the second level becomes larger than energy of the AlN barrier layers 103a and 103b by adding In, electrons are emitted from the InGaN quantum well layer 209 at the first level more stably.

Next, the third effect will be described. By adding 10% of In or more, In starts to segregate, and by adding 30% of In, domains with the high In composition ratio start to be formed as quantum dots within the InGaN quantum well layer 209 at a volume density of approximately 20%. A width (herein, a diameter of the domain which is cylindrical as described below) of the domain seen from a thickness direction of the InGaN quantum well layer 209 is set to approximately from 1 nm to 100 nm. Since this domain has the high In composition ratio, the energy condition thereof becomes lower as compared to its surrounding region.

Figure 8:
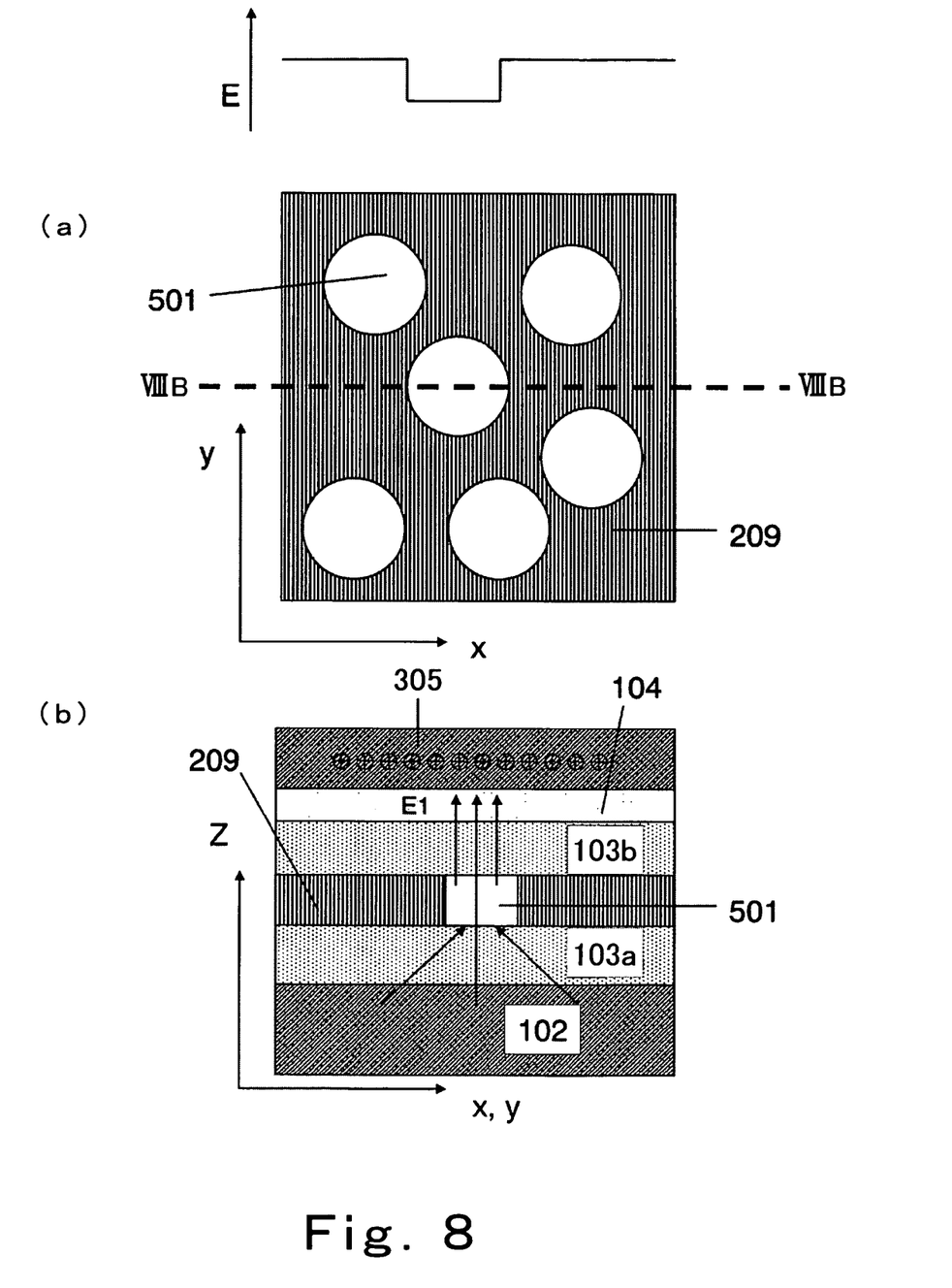
FIG. 8(a) is a plan view schematically showing a condition in which quantum dots are formed in the ballistic semiconductor device in FIG. 6.
FIG. 8(b) is a cross-sectional view taken along line VIIIB-VIIIB in FIG. 8(a)

FIGS. 8(a) and 8(b) are views showing the quantum dots, in which FIG. 8(a) is a plan view schematically showing a condition in which the quantum dots are formed in the ballistic semiconductor device in FIG. 6, and FIG. 8(b) is a cross-sectional view taken along line VIIIB-VIIIB in FIG. 8(a).

As shown in FIGS. 8(a) and 8(b), herein, cylindrical domains (quantum dots) 501 having the In composition ratio higher than that of the InGaN quantum well layer 209 are formed in the InGaN quantum well layer 209. Therefore, a band gap of the domain (quantum dot) 501 is smaller than that of the InGaN quantum well layer 209. The cylindrical domain 501 is formed so as to extend in a thickness direction of the InGaN quantum well layer 209. And, upon the voltage being applied between the AlN barrier layer (emitter) 103a and the base layer 305, electrons within the first AlN barrier layer 103a first conform to a quantum level of the quantum dot 501 having low energy, then pass through the second AlN barrier layer 103b by the resonant-tunneling effect, and are emitted to the base layer 305. Therefore, emission direction of electrons is limited to a direction (thickness direction) perpendicular to the layers. Furthermore, in a quantum dot state, since the electron energy distribution is not affected by a Fermi distribution, the electrons have extremely small energy state and are emitted at a high density.

Figure 9:
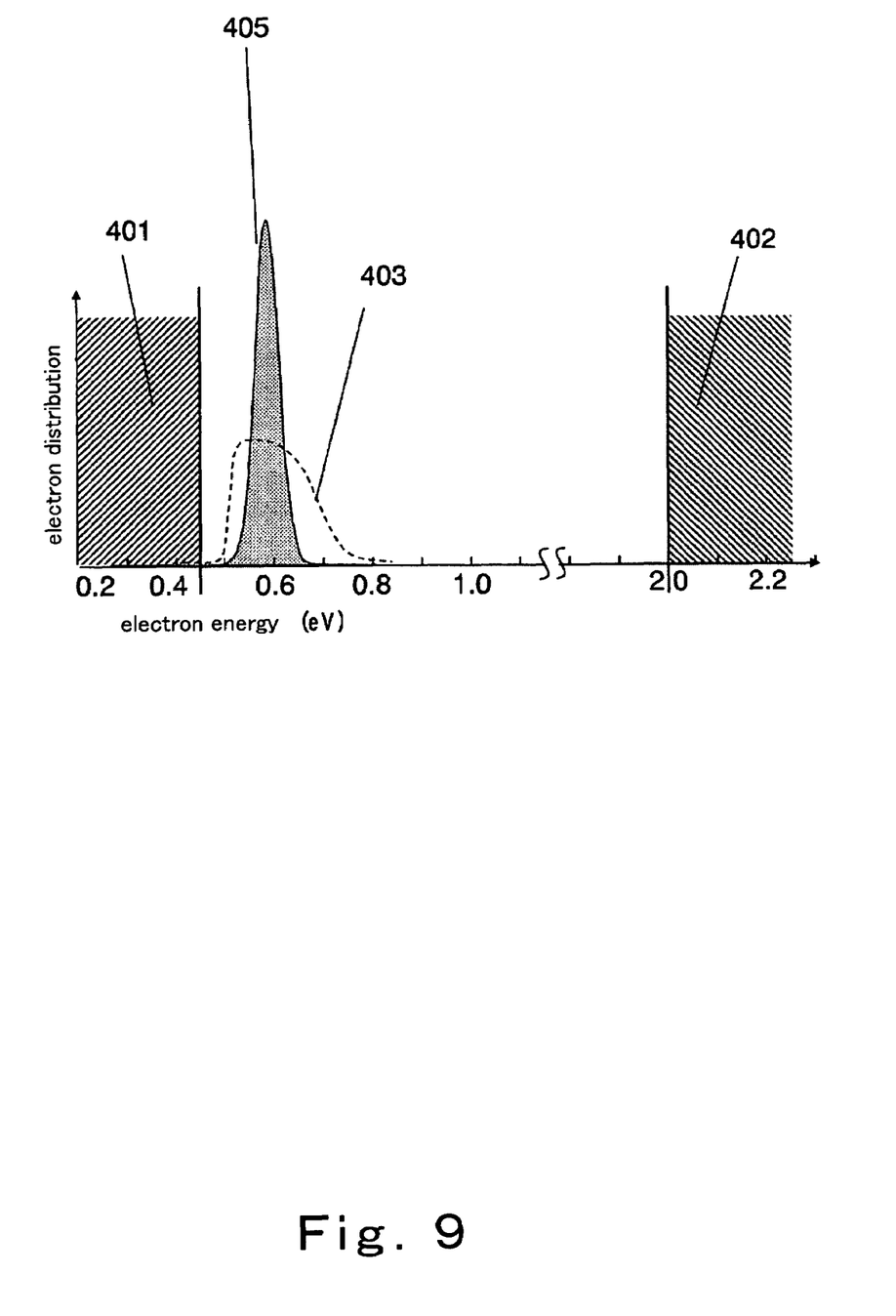
FIG. 9 is a view showing an energy distribution of emitted electrons in the ballistic semiconductor device in FIG. 6.

Consequently, the energy condition of electrons that ballistically conduct becomes steeper. FIG. 9 is a view showing electron energy distributions in the case of the GaN quantum well layer and of the InGaN quantum well layer having the In composition ratio of 30%. As shown in FIG. 9, an electron energy distribution 405 of the InGaN quantum well layer 209 having the In composition ratio of 30% is steeper than the electron energy distribution 403 of the GaN quantum well layer 109. Consequently, it has been proved that a hot electron transistor in which the electron energy distribution is unlikely to spread even when an operation temperature is set as high as 60° C. is realized.

As thus far described, it has been proved that, it is possible to, with the configuration of this embodiment, provide the novel ballistic semiconductor device which is easy to fabricate, and operates at a high speed in a wide temperature range, as compared to the conventional device.

Although the quantum well layer 209 is made of InGaN and the barrier layers are made of AlN in this embodiment, other material systems obtained by combining materials having different energy levels with respect to an electrical charge may be used as long as the band gap of the quantum well layer 209 is smaller than that of the barrier layers 103.

Fourth Embodiment

Figure 10:
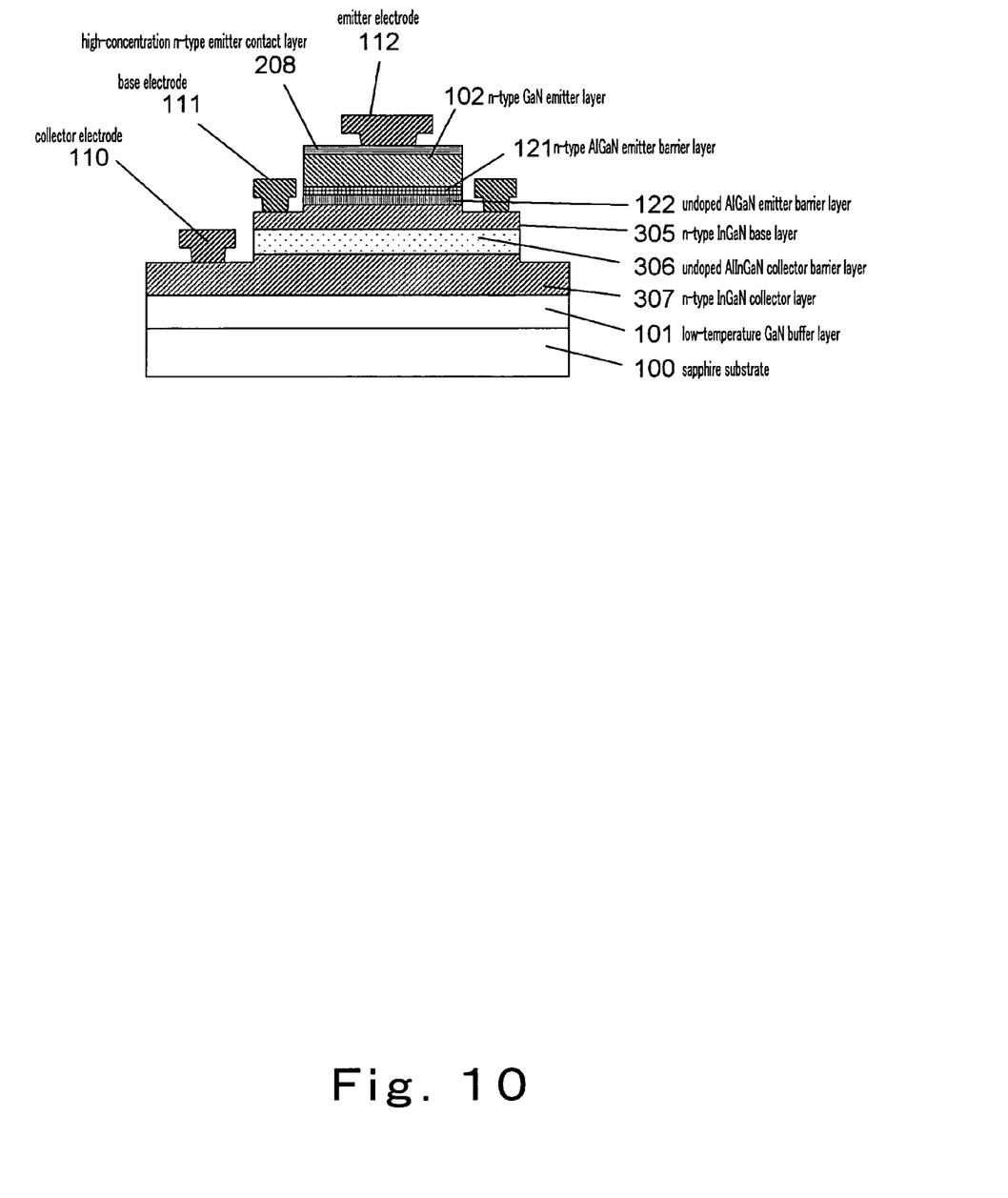
FIG. 10 is a cross-sectional view showing a cross-sectional structure of a ballistic semiconductor device according to a fourth embodiment of the present invention.
Figure 11:
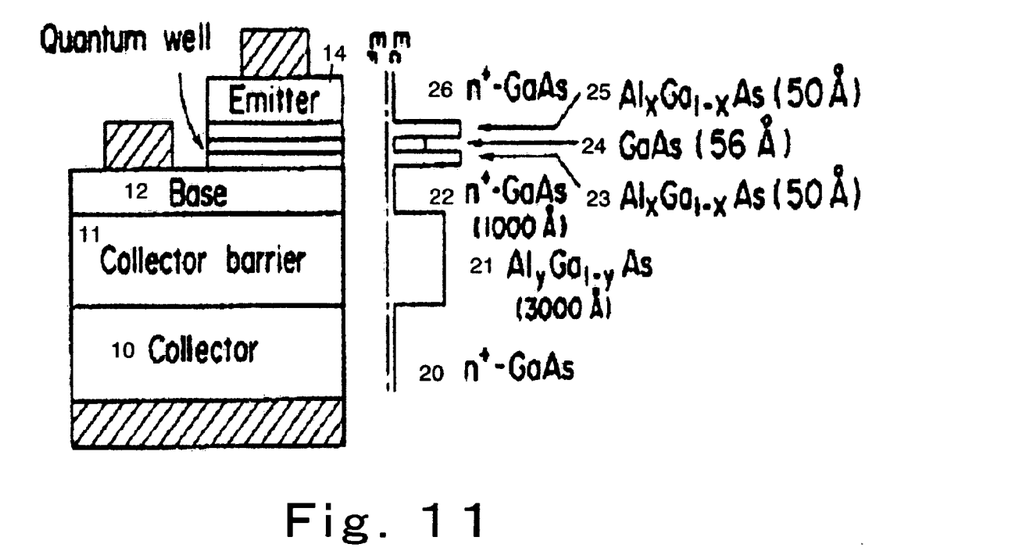
FIG. 11 is a cross-sectional view showing a cross-sectional structure of a ballistic semiconductor device according to a first prior art.

FIG. 10 is a cross-sectional view showing a cross-sectional structure of a ballistic semiconductor device according to a fourth embodiment of the present invention. In FIG. 10, the same reference numerals as those in FIG. 5 denote same or corresponding portions.

As shown in FIG. 10, the ballistic semiconductor device according to this embodiment does not have the resonant-tunneling structure within the emitter, but instead, has a n-type AlGaN emitter barrier layer 121 (thickness d=10 nm, Al concentration n=not less than 5% and not more than 10%) and an undoped AlGaN emitter barrier layer 122 (thickness d=10 nm, Al concentration n=not less than 5% and not more than 10%). And, the ballistic semiconductor device is formed on the sapphire substrate 100. Other configuration is identical to that of the second embodiment. In such a configuration, electrons which have gone over the energy barriers of the emitter barrier layers 121 and 122 are emitted to the base layer 305 from the emitters 121 and 122. Other operation is identical to that of the second embodiment. Therefore, it is possible to obtain the same effect as in the second embodiment.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

A ballistic semiconductor device according to the present invention is useful as a transistor capable of operating at a high speed.

The invention claimed is:

1. A ballistic semiconductor device comprising:
   a n-type emitter layer;
   a base layer made of n-type InGaN;
   a n-type collector layer;
   an emitter barrier layer interposed between the emitter layer and the base layer and having a band gap larger than a band gap of the base layer; and
   a collector barrier layer interposed between the base layer and the collector layer and having a band gap larger than the band gap of the base layer, wherein
   the ballistic semiconductor device operates at 10 GHz or higher.

2. The ballistic semiconductor device according to claim 1, wherein
   concentration of In contained in the base layer is not less than 0.1% and not more than 5%.

3. The ballistic semiconductor device according to claim 1, wherein
   the collector barrier layer is made of AlInGaN.

4. The ballistic semiconductor device according to claim 3, wherein
   concentration of In contained in the collector barrier layer is not less than 0.1% and not more than 5%.

5. The ballistic semiconductor device according to claim 1, wherein
   the collector layer is made of InGaN.

6. The ballistic semiconductor device according to claim 5, wherein
   concentration of In contained in the collector layer is not less than 0.1% and not more than 5%.

7. The ballistic semiconductor device according to claim 1, wherein
   the collector barrier layer is made of AlInGaN, and
   the collector layer is made of InGaN.

8. The ballistic semiconductor device according to claim 7, wherein
   concentration of In contained in the base layer, concentration of In contained in the collector barrier layer, and concentration of In contained in the collector layer are each not less than 0.1% and not more than 5%.

9. The ballistic semiconductor device according to claim 1, wherein
   the emitter barrier layer is formed by an AlGaN layer which contacts both the emitter layer and the base layer.

10. The ballistic semiconductor device according to claim 9, wherein
    the AlGaN layer is formed by a layered structure of a n-type AlGaN layer and an undoped AlGaN layer.

11. The ballistic semiconductor device according to claim 10, wherein
    the n-type AlGaN layer contacts the emitter layer, and the undoped AlGaN layer contacts the base layer.

12. The ballistic semiconductor device according to claim 1 comprising:
    two or more emitter barrier layers, wherein
    a quantum well layer is interposed between two adjacent emitter barrier layers.

13. The ballistic semiconductor device according to claim 12, wherein
    the quantum well layer is made of InGaN.

14. The ballistic semiconductor device according to claim 13, wherein
    concentration of In contained in the quantum well layer is not less than 10% and not more than 30%.

15. The ballistic semiconductor device according to claim 13, wherein
    a quantum dot having a band gap smaller than a band gap of the quantum well layer is formed in the quantum well layer.

16. The ballistic semiconductor device according to claim 15, wherein
    a width of the quantum dot seen from a thickness direction of the quantum well layer is not less than 1 nm and not more than 100 nm.

* * * * *